(12) United States Patent
Hinata et al.

(10) Patent No.: US 11,527,578 B2
(45) Date of Patent: Dec. 13, 2022

(54) LIGHT EMITTING DEVICE

(71) Applicant: CANON KABUSHIKI KAISHA, Tokyo (JP)

(72) Inventors: Shoma Hinata, Ebina (JP); Akira Okita, Yamato (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/924,889

(22) Filed: Jul. 9, 2020

(65) Prior Publication Data

US 2021/0013265 A1    Jan. 14, 2021

(30) Foreign Application Priority Data

Jul. 12, 2019   (JP) .............. JP2019-130385

(51) Int. Cl.
| | | |
|---|---|---|
| G09G 3/36 | (2006.01) | |
| H01L 27/32 | (2006.01) | |
| G06F 3/01 | (2006.01) | |
| G09G 3/3225 | (2016.01) | |
| H01L 51/52 | (2006.01) | |
| H04N 5/225 | (2006.01) | |
| H04N 5/247 | (2006.01) | |

(52) U.S. Cl.
CPC ........... *H01L 27/322* (2013.01); *G06F 3/013* (2013.01); *G09G 3/3225* (2013.01); *H01L 51/5265* (2013.01); *G09G 2340/0407* (2013.01); *G09G 2354/00* (2013.01); *H01L 27/3234* (2013.01); *H04N 5/2257* (2013.01); *H04N 5/247* (2013.01)

(58) Field of Classification Search
CPC .. H04M 1/0266; H04M 1/72454; G09G 3/36; G09G 5/00; G09G 3/32; G09G 3/3225; G06F 3/038; G06F 3/013; H01L 51/5265; H01L 27/322; H04N 5/247; H04N 5/2257; H06G 3/013
See application file for complete search history.

(56) References Cited

U.S. PATENT DOCUMENTS

| | | | |
|---|---|---|---|
| 2011/0007047 A1* | 1/2011 | Fujioka | G02F 1/133509 345/207 |
| 2012/0113160 A1* | 5/2012 | Kurokawa | G06F 3/042 362/84 |
| 2015/0009313 A1 | 1/2015 | Noda | |
| 2015/0371573 A1 | 12/2015 | Choi | |
| 2016/0313549 A1* | 10/2016 | Agrawal | G02F 1/1335 |
| 2017/0163914 A1* | 6/2017 | Hara | H04N 9/04559 |
| 2018/0261652 A1 | 9/2018 | Kim | |
| 2019/0317597 A1* | 10/2019 | Aleem | G06V 40/19 |
| 2020/0134281 A1 | 4/2020 | Han | |
| 2021/0151484 A1* | 5/2021 | Moriya | G02B 5/20 |

FOREIGN PATENT DOCUMENTS

| | | |
|---|---|---|
| JP | 2012-113291 A | 6/2012 |
| JP | 2015-013031 A | 1/2015 |
| WO | 2018/176805 A1 | 10/2018 |

* cited by examiner

*Primary Examiner* — Pegeman Karimi
(74) *Attorney, Agent, or Firm* — Canon U.S.A., Inc. IP Division

(57) ABSTRACT

The disclosure provides a light emitting device including a display element and an infrared light emitting element that are disposed on an insulating layer; and a reducer configured to reduce a quantity of light that is emitted in a direction of the display element from the infrared light emitting element in plan view from a direction perpendicular to the insulating layer.

21 Claims, 6 Drawing Sheets

LIGHT EMITTING DEVICE

BACKGROUND OF THE INVENTION

Field of the Invention

The aspect of the embodiments relates to a light emitting device having the function of emitting infrared light for detecting a line of sight, and to a display device and an imaging device including the light emitting device.

Description of the Related Art

An organic light emitting device is a device that emits light by applying a voltage to a light emitting layer including an organic compound layer. Since the organic light emitting device is a self-luminous device, the organic light emitting device does not need to separately include a light source and a display control for, for example, a shutter, as they are in a liquid crystal display device. Therefore, the organic light emitting device can be made thinner and can have lower power consumption than the liquid crystal display device. Consequently, the organic light emitting device is drawing attention as an image display device for what are called wearable devices, such as camera viewfinders, head mount displays, and smart glasses.

In such a display device, there is a desire to, by detecting a line of sight of a user with respect to the display device, detect a location of sight of the user and reflect a viewing location of the user in a driving operation of the display device based on detected line-of-sight information.

Japanese Patent Laid-Open No. 2015-13031 (hereinafter PTL 1) discloses a device that detects a line of sight by illuminating an eyeball of a user looking through a finder with infrared light, serving as detection light, and capturing reflected light from the eyeball by a detector.

Japanese Patent Laid-Open No. 2012-113291 (hereinafter PTL 2) discloses a display device having an imaging function and including imaging detection light-source pixels as subpixels of display light-source pixels.

In the display device described in PTL 1, the display unit, the infrared light emitting unit for detecting a line of sight, and the infrared imaging unit are provided separately, and a light path for visible light and a light path for infrared light are separated by a light-path changing element. Since these are provided separately, the display device is large.

On the other hand, the display device described in PTL 2 includes a display element and an imaging light-source element on the same substrate. However, visible light of the display element and infrared light of the imaging light-source element are spectrally separated from white light by color filters. Therefore, light emissions of the display element and the imaging light-source element that are adjacent to each other are influenced by leakage light leaking from one of the display element and the imaging light-source element to the other of display element and the imaging light-source element and vice versa, and may be unintentionally seen by a user. This issue becomes more serious when the display device is reduced in size.

SUMMARY OF THE INVENTION

The aspect of the embodiments provides a light emitting device that makes it possible to, by reducing the frequency with which visible light that is emitted by an infrared light emitting element becomes leakage light that leaks to an adjacent pixel, decrease a reduction in display quality even if the display device is reduced in size.

An aspect of the embodiments provides a light emitting device including a display element and an infrared light emitting element that are disposed on an insulating layer; and a reducer configured to reduce a quantity of light that is emitted in a direction of the display element from the infrared light emitting element in plan view from a direction perpendicular to the insulating layer.

Further features of the disclosure will become apparent from the following description of exemplary embodiments with reference to the attached drawings.

DESCRIPTION OF THE EMBODIMENTS

A display device according to an embodiment of the disclosure is described below with reference to the drawings. Well-known or publicly known technologies of the technical field may be applied to portions that are not particularly illustrated or described in the specification. The disclosure is not limited to embodiments that are described below.

Figure 1:
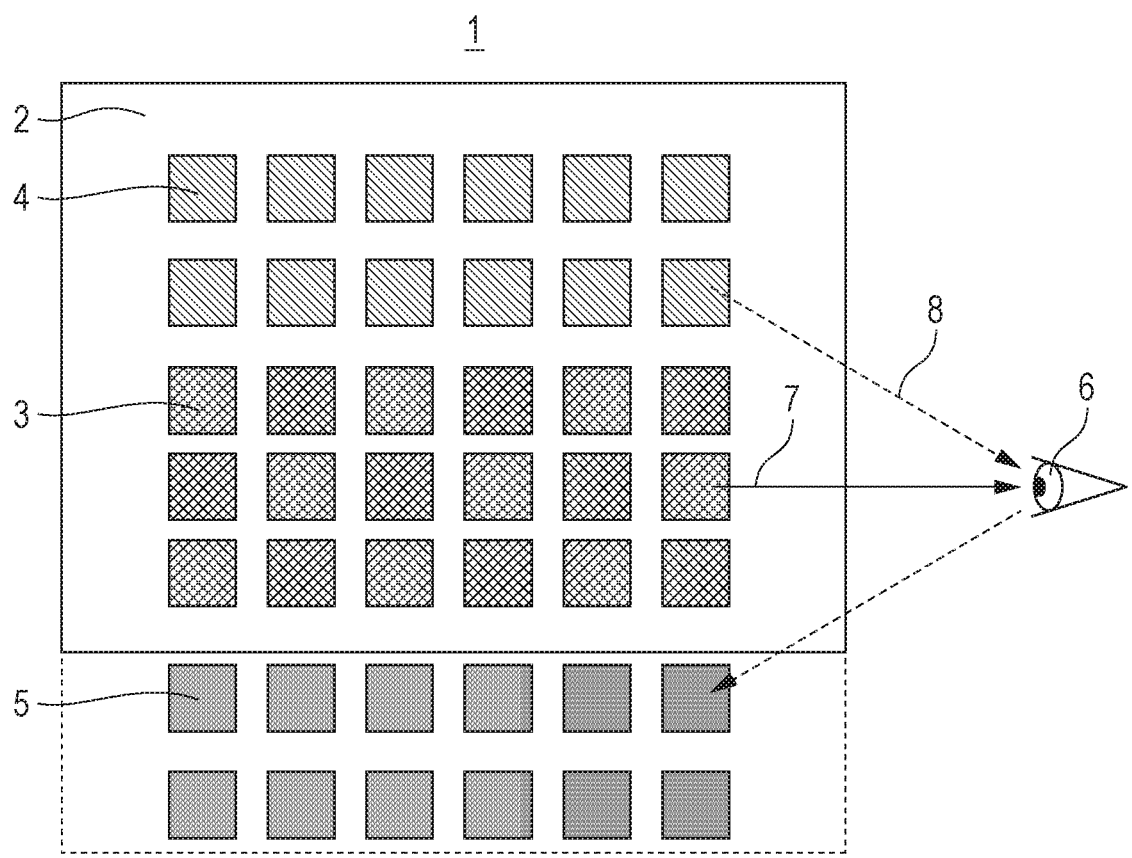
FIG. 1 is a schematic view of an exemplary structure of an organic light-emitting display device according to an embodiment of the disclosure.

FIG. 1 is a schematic view showing a structure of a display device 1 according to the embodiment of the disclosure and a line-of-sight detection operation. In the display device 1, a display unit 3 and an infrared light emitting unit 4 are disposed on an insulating layer 2 provided on a substrate. The display unit emits display light 7 to form a display image. On the other hand, the infrared light emitting unit 4 emits infrared light 8 with respect to an eyeball 6 of a user gazing at the display image. By detecting the emitted infrared light 8 reflected from the eyeball by an imaging unit 5 including light receiving elements, an imaging image of the eyeball is obtained. By providing a reducer that reduces the quantity of light emitted to the display unit from the infrared light emitting unit in the plan view, a reduction in image quality is decreased.

On the basis of the imaging image of the eyeball obtained by the infrared imaging, a line of sight of the user with respect to the display image is detected. Any publicly known method can be applied to the line-of-sight detection using the imaging image of the eyeball. As an example, a line-of-sight detection method based on a Purkinje image obtained by reflection of illumination light at the cornea can be used.

More specifically, a line-of-sight detection operation based on a pupil corneal reflection method is performed. By making use of the pupil corneal reflection method, on the basis of the Purkinje image and a pupil image included in the imaging image of the eyeball 6, a line-of-sight vector representing the orientation (rotation angle) of the eyeball is calculated, as a result of which the line of sight of the user is detected.

The reducer that reduces the quantity of light emitted to the display unit from the infrared light emitting unit in the plan view is described in detail in each embodiment.

The insulating layer 2 is an insulating layer that is provided on the substrate, such as a silicon substrate, a glass substrate, or a plastic substrate. The insulating layer 2 may be made of an organic compound or an inorganic compound. The insulating layer 2 may be provided for the purpose of protecting a transistor on the substrate or planarizing portions above the transistor, or may be an inter-layer insulating layer for the transistor provided on the substrate. More specifically, the inorganic compound may be silicon oxide, silicon nitride, or silicon oxynitride. The organic compound may be polyacrylate, polyimide, or epoxy resin.

The display unit 3 includes display elements that are capable of emitting visible light. In the specification, the display elements are also called light emitting elements in that they emit visible light. The display unit may include organic light-emitting elements including a first electrode, an organic compound layer including a light emitting layer, and a second electrode in this order from the insulating layer. Light emitted from the display unit may be light having any color or white light. Alternatively, light emitted from the display unit may have colors differing for respective light emitting pixels. A region in which the display unit 3 is disposed is a first light emitting region that emits visible light.

The infrared light emitting unit 4 is not particularly limited to certain infrared light emitting units as along as the infrared light emitting unit 4 includes infrared light emitting elements that are capable of emitting infrared light. The infrared light emitting unit 4 may include, for example, organic light emitting elements or LED elements. A region in which the infrared light emitting unit 4 is disposed is a second light emitting region. In one embodiment, the infrared light emitting elements are organic light emitting elements because the organic light emitting elements and the infrared light emitting elements can be manufactured by the same process. When the infrared light emitting elements are organic light emitting elements, as with the display unit 3, the organic light emitting elements may include a first electrode, an organic compound layer including a light emitting layer, and a second electrode in this order from the insulating layer.

In one embodiment, the imaging unit 5 including light receiving elements having an imaging element that is sensitive to an infrared range, and is, for example, a photodiode, an organic photoelectric transducer, or an inorganic photoelectric transducer. The imaging unit may be formed on the same substrate as the display unit 3 and the infrared light emitting unit 4, or may be formed on a different substrate and be a separate member. An infrared filter that passes only infrared light therethrough may be provided above the imaging element because this makes it possible to reduce erroneous detection caused by incident visible light.

First Embodiment

A structure of display elements and infrared light emitting elements of a display device according to an embodiment of the disclosure is described in detail below. A reducer according to the embodiment is a light absorbing layer that is disposed between a display unit and an infrared light emitting unit.

Figure 2:
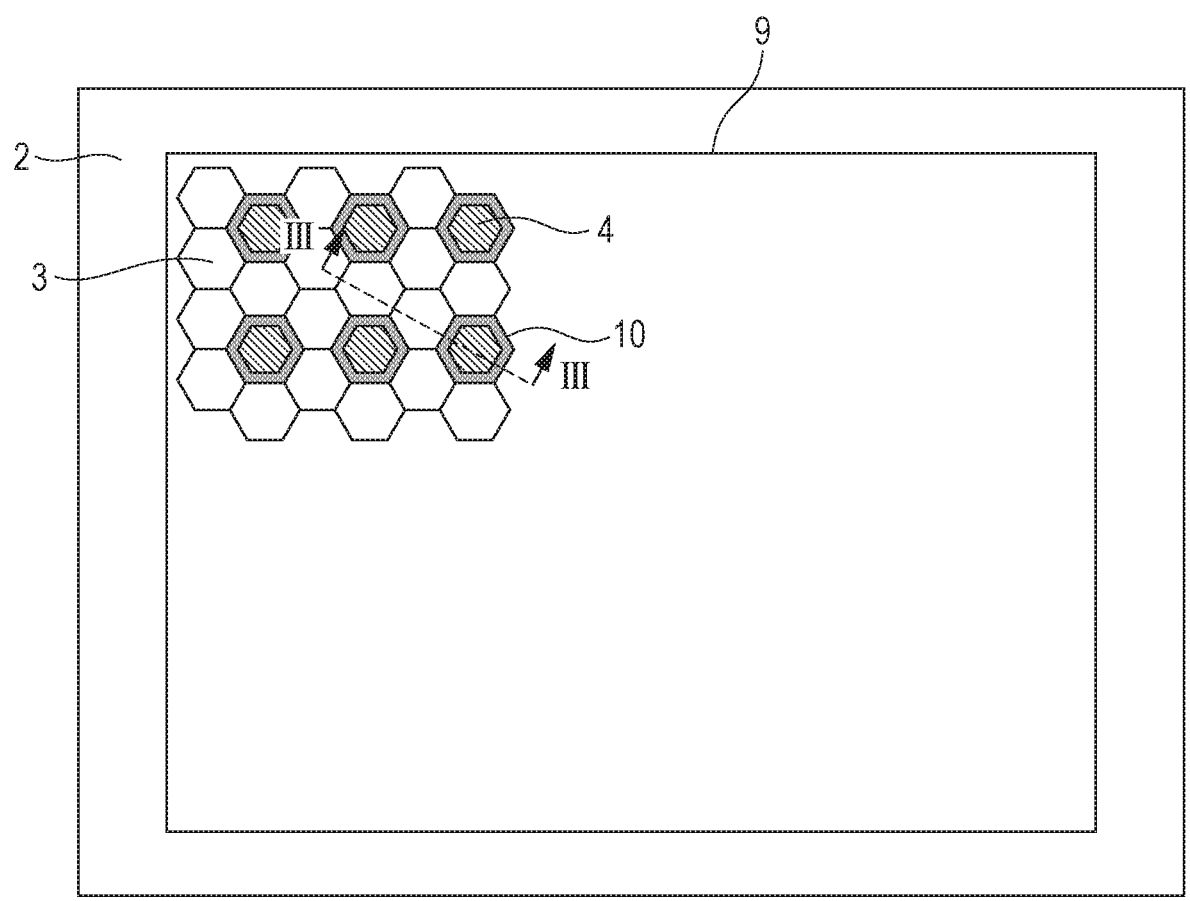
FIG. 2 is a plan view of an exemplary organic light-emitting display device according to an embodiment of the disclosure.
Figure 3:
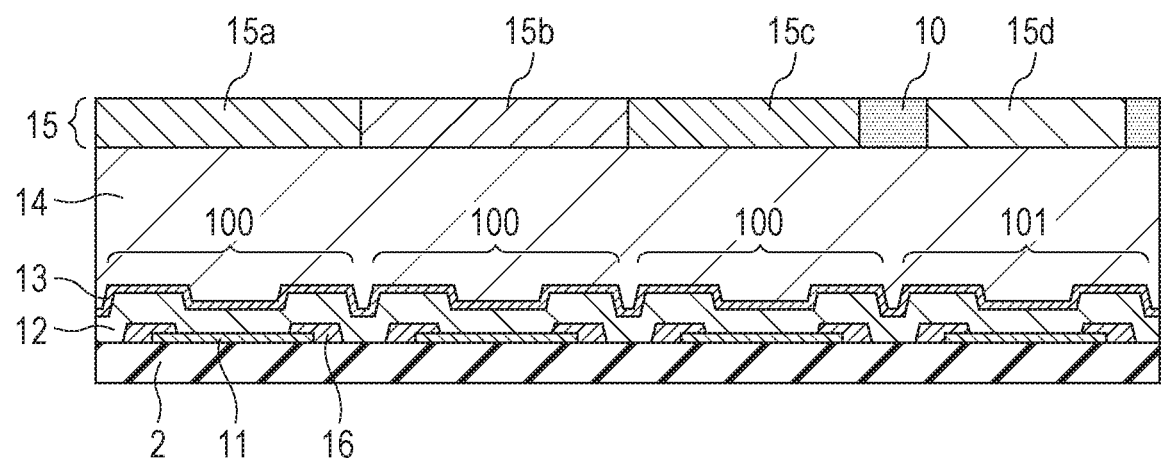
FIG. 3 is a sectional view of the exemplary organic light-emitting display device according to the embodiment of the disclosure.

FIG. 2 is a schematic plan view of the display device according to the embodiment. FIG. 3 is a schematic sectional view along section III-III.

In the embodiment, a display unit 3 and an infrared light emitting unit 4 are disposed on an insulating layer 2, and constitute a display region 9. A light absorbing layer 10 is disposed as the reducer according to the embodiment in the vicinity of the infrared light emitting unit 4. The light absorbing layer is an example of the reducer that reduces the quantity of leakage light leaking to light emitting elements from infrared light emitting elements, and may be a layer that absorbs light. The light may contain visible light and infrared light. A form in which only visible light is absorbed may be used.

FIG. 3 is a schematic sectional view along section in FIG. 2. Each light emitting element 100 includes a first electrode 11 on the insulating layer 2, a functional layer 12 including a light emitting layer, a second electrode 13, a bank 16 that covers an end portion of the first electrode, a protective layer 14 on the second electrode of the light emitting element, and a color filter 15. The functional layer including a light emitting layer may be an organic compound layer or an inorganic compound layer.

Each first electrode 11 may be transparent or non-transparent. When each first electrode 11 is non-transparent, in one embodiment, a metal material has a reflectivity of 70% or greater at a light emission wavelength be used. As the metal material, a metal, such as Al or Ag, an alloy of the metal and Si, Cu, Ni, Nd, or the like, or ITO, IZO, AZO, or IGZO can be used. Here, the light emission wavelength refers to a spectral range that is emitted from the functional layer 12. If the reflectivity is higher than a desired reflectivity of each first electrode, each first electrode may be an electrode stacked on a barrier electrode made of, for example, a metal, such as Ti, W, Mo, or Au, or an alloy thereof, or may be an electrode stacked on a transparent oxide film electrode made of, for example, ITO or IZO.

In contrast, if each first electrode 11 is a transparent electrode, a reflecting layer may be further provided below each first electrode 11. As each transparent electrode, for example, ITO, IZO, AZO, or IGZO can be used. For the purpose of optimizing an optical distance mentioned below, an insulating film may be further provided between the reflecting layer and a transparent conductive film.

Each second electrode 13 is disposed on the functional layer 12 and is a light transmissive electrode. Each second electrode 13 may be made of a semi-transmissive material that has the property of passing a portion of light that has reached a surface of each second electrode 13 and reflecting the other portion of the light (that is, has a semi-transmissive, semi-reflective property). Examples of materials out of which each second electrode 13 is made include transparent materials, such as transparent conductive oxides, a single metal, such as aluminum, silver, and gold, an alkali metal, such as lithium and cesium, an alkali earth metal, such as magnesium, potassium, and barium, and semi-transmissive materials made of alloy materials containing these metal materials. In one embodiment, the semi-transmissive materials be, in particular, alloys whose main component is magnesium or silver. If each second electrode 13 is to have a desirable transmissivity, each second electrode 13 may have a layered structure of the aforementioned materials.

A second electrode 13 may be shared by the plurality of light emitting elements 100 and a plurality of infrared light emitting elements 101. That is, a common second electrode may be formed on the entire display region 9 in FIG. 2.

When each first electrode is a positive electrode, each second electrode is a negative electrode; and when each first electrode is a negative electrode, each second electrode is a positive electrode. Each first electrode 11 may be a positive electrode and each second electrode 13 may be a negative electrode and vice versa.

The functional layer 12 is disposed on the first electrodes 11 and can be formed by a publicly known technology, such as evaporation or spin coating.

The functional layer 12 may include a plurality of layers. When the functional layer is an organic compound layer, examples of the plurality of layers include a hole injection layer, a hole transport layer, an electronic block layer, a light emitting layer, a hole block layer, an electron transport layer, and an electron injection layer. The light emitting layer emits light as a result of a re-combination of a hole injected from a positive electrode and an electron injected from a negative electrode in the organic compound layer. One or more light emitting layers may be used. Any one of the light emitting layers may contain a red light emitting material, a green light emitting material, a red light emitting material, and an infrared light emitting material. By combining the emission colors, it is also possible to obtain white light. Alternatively, any one of the light emitting layers may contain light emitting materials having complementary colors, such as a blue light emitting material and a yellow light emitting material. Alternatively, light rays having different colors may be emitted by changing the structures of and the materials contained in the light emitting layers according to light emitting pixels.

When the functional layer 12 is capable of emitting light having a wavelength range extending from a visible range to the infrared range, the light emitting elements and the infrared light emitting elements may each include a first electrode, a light emitting layer, and a second electrode in this order from the side of the insulating layer. One light emitting layer may be provided for the light emitting elements and the infrared light emitting elements. That is, one light emitting layer may be shared by the plurality of light emitting elements and the plurality of infrared light emitting elements.

The light emitting elements and the infrared light emitting elements may each include a light emitting layer. In this case, the light emitting layers may be patterned for the respective light emitting elements 100 and the respective infrared light emitting elements 101.

The display device according to the embodiment of the disclosure may include an element including a first reflecting surface and a second reflecting surface and a light emitting layer disposed between the first reflecting surface and the second reflecting surface. The light emitting elements and the infrared light emitting elements above may have this structure. The first reflecting surface may be a first electrode or a reflecting layer disposed between the first electrode and the insulating layer.

In order to optimize for each color the optical distance between the first reflecting surface and a light emitting position of the functional layer 12 including a light emitting layer, when an optical path length from an upper side of the first reflecting surface to the light emitting position of the functional layer 12 is Lr and a phase shift of the reflecting layer is $\Phi r$:

$$Lr=(2m-(\Phi r/\pi))\times(\lambda/4). \quad (1)$$

where m is an integer greater than or equal to 0. The first electrode 11 or the first reflecting surface, and the film thickness of the functional layer 12 may be optimized for each color so as to substantially satisfy Formula (1) above.

If the phase shift when light having a wavelength $\lambda$ is reflected by the second reflecting surface is $\Phi s$, an optical distance Ls from the light emitting position to the second reflecting surface substantially satisfies the following Formula (2). In the embodiment, M'=0.

$$Ls=(2m'-(\Phi s/\pi))\times(\lambda/4)=-(\Phi s/\pi)\times(\lambda 4) \quad (2)$$

Therefore, a total layer interference L substantially satisfies:

$$L=Lr+L=(2m-\Phi/\pi)\times(\lambda/4) \quad (3)$$

Here, $\Phi$ is a sum $\Phi r+\Phi s$ of the phase shift when the light having the wavelength $\lambda$ is reflected by the first electrode 11 or the reflecting layer and the second electrode 13.

Here, "substantially satisfies" above means that in Formulas (1) to (3), an allowable range is approximately $\lambda/8$ or approximately 20 nm.

The optical distance of the display elements and the optical distance of the infrared light emitting elements may differ from each other. Due to this structure, in each display element, the distance allows the intensity of visible light to be increased and in each infrared light emitting element, the distance allows infrared light emission to be increased. Specifically, the distance between the first reflecting surface and the second reflecting surface of each display element and the distance between the first reflecting surface and the second reflecting surface of each infrared light emitting element may differ from each other. Alternatively, the distance between the first reflecting surface of each display element and an interface of the functional layer on a side of the first reflecting surface and the distance between the first reflecting surface of each infrared light emitting element and an interface of the functional layer on a side of the first reflecting surface may differ from each other. Alternatively, the distance between an interface of the functional layer on a side of the second reflecting surface and the second reflecting surface of each display element and the distance between an interface of the functional layer on a side of the second reflecting surface and the second reflecting surface of each infrared light emitting element may differ from each other.

It may be difficult to identify a light emitting position of each light emitting layer. Therefore, in the structures above, the interface of the functional layer on the side of each first reflecting surface or the interface of the functional layer on the side of each second reflecting surface is used as a substitute for the light emitting position. Considering the allowable ranges above, even if such substitutions are made, it is possible to realize the effect of increasing the intensity of light.

Due to the structures above, while the light emitting elements 100 and the infrared light emitting elements 101 share the functional layer 12, the light emitting elements 100 are capable of mainly emitting visible light and the infrared light emitting elements 101 are capable of emitting infrared light. In addition, since the functional layer 12 is shared, it is possible to simplify an organic layer formation process. Alternatively, in each infrared light emitting element, the distance may allow the intensity of infrared light to be increased and the intensity of visible light to be decreased.

As described above, even if light that is emitted from the infrared light emitting elements 101 in a direction of a front surface thereof is caused to be only light in the infrared range by using a method of adjusting optical distances and a method of patterning the functional layer 12, it is desirable to decrease reduction in display quality by using the reducer according to the embodiment of the disclosure. This is because since light that is emitted obliquely from the infrared light emitting elements has a shorter wavelength than the wavelength of light that is emitted in the direction of the front surface thereof, light that is emitted from the infrared light emitting elements to the light emitting elements may be light in the visible range.

In one embodiment, the protective layer 14 is to be made of an inorganic material having light transmittance and having low permeability to external oxygen and external moisture. In particular, inorganic materials such as silicon nitrides (SiN), silicon oxynitrides (SiON), silicon oxides ($SiO_x$), aluminum oxides ($Al_2O_3$), and titanium oxides ($TiO_2$) are used. In particular, from the viewpoint of protection performance, inorganic materials such as SiN, SiON, and $Al_2O_3$ are used. the protective layer 14 is formed by a chemical vapor deposition method (CVD method), an atomic layer deposition method (ALD method), or a sputtering method. As long as the protective layer 14 has sufficient moisture blocking performance, the protective layer 14 may have a single layer structure or a layered structure formed by combining any of the materials above and any of the formation methods above. For example, the protective layer 14 may be a layered structure including a silicon nitride layer and a layer having a high density formed by the atomic layer deposition method. Further, as long as the protective layer retains its moisture blocking performance, the protective layer may include an organic layer. Examples of the organic layer include polyacrylate, polyimide, polyester, and epoxy.

Further, the protective layer 14 may be disposed on the plurality of light emitting elements 100 and the plurality of infrared light emitting elements 101.

The color filters 15 are disposed on the protective layer 14. Color filters 15a, 15b, and 15c are color filters that pass visible light, and a color filter 15d is a color filter that passes infrared light. The color filters 15a, 15b, and 15c may be color filters that pass different corresponding colors, and may be color filters that pass red light, green light, and blue light corresponding thereto.

Although in the embodiment, an example in which a full-color display can be performed by using color filters that pass light rays having three corresponding colors is described, a structure including some of the color filters 15 or a structure including none of the color filters 15 may be used.

A planar arrangement of the light emitting elements 100 and the infrared light emitting elements 101 may be a stripe arrangement, a square arrangement, a delta arrangement, a PenTile arrangement, or a Bayer arrangement. By disposing main pixels in a matrix, a display device having a large number of pixels can be provided.

As long as detection of a line of sight is not hindered, one infrared light emitting element 101 each may be provided for every plurality of light emitting elements 100 and the infrared light emitting elements 101 may be disposed at equal intervals or randomly disposed, or the infrared light emitting elements 101 need not be disposed over the entire display region. Considering suitable sizes for a displaying operation and suitable sizes for detecting a line of sight, the sizes of the light emitting elements 100 may differ from the sizes of the infrared light emitting elements.

When the infrared light emitting elements are not disposed in the display region, the infrared light emitting elements correspond to the first light emitting region that emits visible light and the second light emitting region that emits infrared light, and the second light emitting region may be disposed between the first light emitting region and an end of the insulating layer or an end of the substrate and between the first light emitting region and another end of the insulating layer or another end of the substrate differing from the end of the insulating layer or the end of the substrate. In this case, the first light emitting region need not be disposed between the second light emitting region and the end of the insulating layer or the end of the substrate. Similarly, the first light emitting region need not be disposed between the second light emitting region and the other end of the insulating layer or the other end of the substrate.

Alternatively, the second light emitting region may surround the first light emitting region.

The light absorbing layer 10 may be disposed in a region between the infrared light emitting elements 101 and the light emitting elements 100 in the plan view. In a delta arrangement shown in FIG. 2, the light absorbing layer 10 may surround the infrared light emitting elements 101. The light absorbing layer may also be called a light intercepting layer.

Of light rays that are emitted from the infrared light emitting elements 101, the light absorbing layer 10 is a layer that absorbs a component of the visible range, and, for example, may have a structure in which a pigment, carbon black, or the like is dispersed in photosensitive resin similar to that of the color filters 15. Alternatively, the light absorbing layer 10 may be constituted by two or more types of color filters that are stacked upon each other.

The light absorbing layer 10 may absorb light in the visible range including particular wavelengths. That is, the light absorbing layer 10 need not absorb light in all wavelength ranges. For example, when a structure in which the functional layer of the light emitting elements 100 and the infrared light emitting elements 101 is patterned and only infrared light having wavelengths of approximately 750 to 850 nm is applied in the direction of the front surface of each infrared light emitting element 101, a visible component of light that is emitted obliquely is only light in a red wavelength range. Therefore, in such a structure, the light absorbing layer 10 is capable of absorbing light in the red wavelength range, and may be made of, for example, a material that is the same as the material of which the color filter 15c that passes blue light therethrough is made.

Second Embodiment

Figure 4:
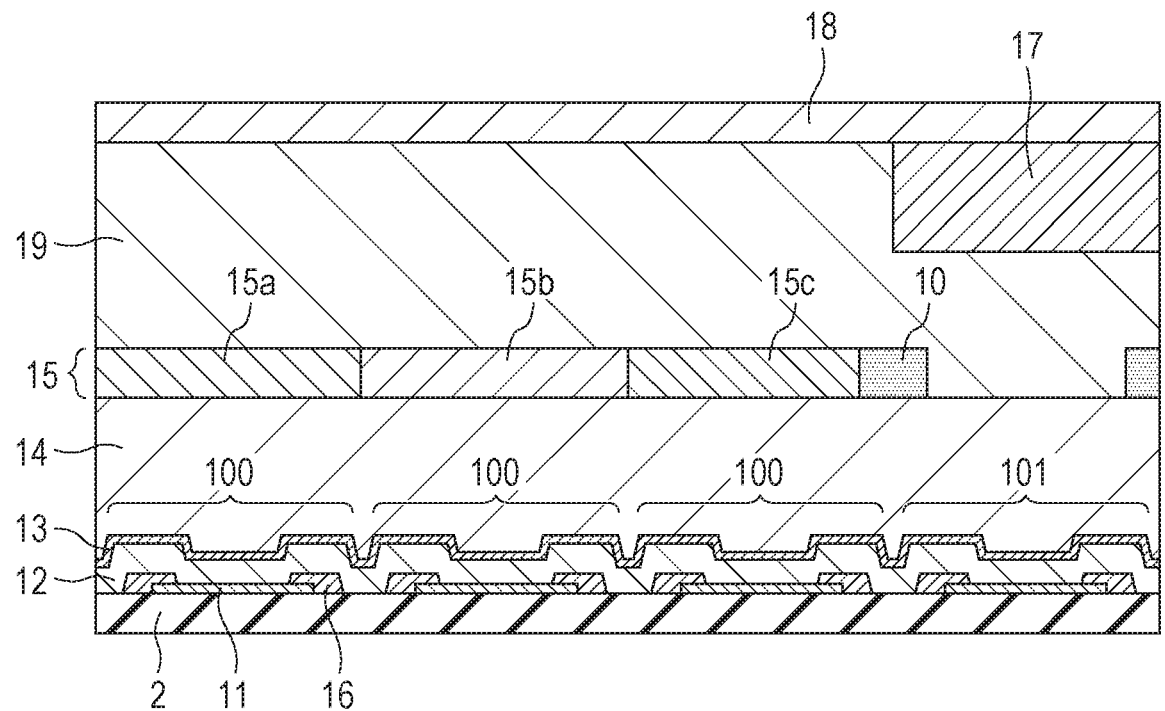
FIG. 4 is a sectional view of an exemplary organic light-emitting display device according to an embodiment of the disclosure.

FIG. 4 is a schematic sectional of a display device according to a second embodiment. A reducer in the embodiment is a light absorbing layer 10. In the embodiment, instead of the color filter 15d having the above-described structure, a wavelength converting layer 17 is disposed above infrared light emitting elements 101.

The wavelength converting layer 17 absorbs visible light and includes a material that emits infrared light. Examples of the material include quantum dots and organic pigments.

Quantum dots that are used are particles made of a material, such as InP, CdS, PbS, ZnS, or CdSe, whose structure and particle size have been adjusted to absorb light that is in a visible light range and to have a light emission peak in an infrared range. The particle sizes thereof are, for example, greater than or equal to 2 nm and less than or equal to 10 nm. Core-shell quantum dots or Perovskite quantum dots may be used.

As shown in FIG. 4, the wavelength converting layer 17 may be formed on a facing substrate 18 and bonded to the substrate to face the substrate, or may be formed, for example, above a protective layer 14 as a layer that is the same as a color filter 15. A gap 19 that is formed when the facing substrate 18 is caused to face another substrate may contain a gas, such as air or an inert gas, or may be filled with resin or the like. Forming the wavelength converting layer on the facing substrate is used because heat, light, or the like in the step of forming the wavelength converting layer does not influence the functional layer. In particular, when the functional layer is an organic compound layer, providing the wavelength converting layer on the facing substrate is used because little damage caused by heat or light occurs in terms of a process.

In the embodiment, the infrared light emitting elements 101 emit visible light, and the visible light is converted into infrared light by the wavelength converting layer 17. In this structure, since the infrared light emitting elements 101 is to emit visible light, the structure of the infrared light emitting elements 101 can be the same as the structure of light emitting elements 100, as a result of which a manufacturing process can be simplified.

Although in the embodiment, the wavelength converting layer 17 is disposed instead of the color filter 15d, other structures may be used. The color filter and the wavelength converting layer may be stacked, or the stacking order may be selected as appropriate.

The light absorbing layer 10 may be provided on the protective layer as shown in FIG. 4, or may be provided on the facing substrate.

Third Embodiment

Figure 5:
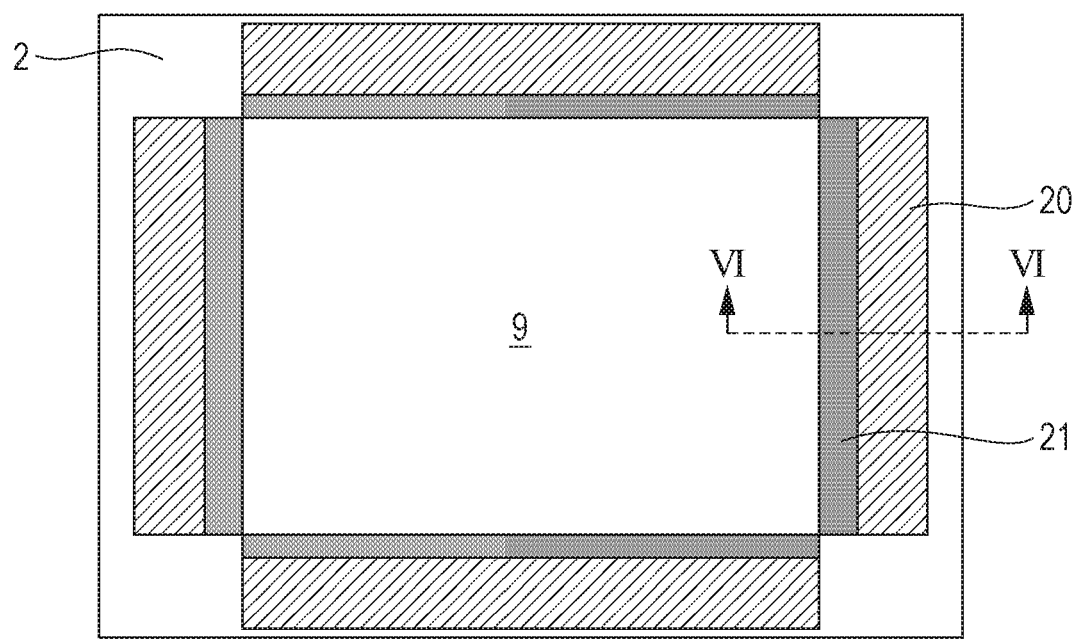
FIG. 5 is a plan view of an exemplary organic light-emitting display device according to an embodiment of the disclosure.
Figure 6:
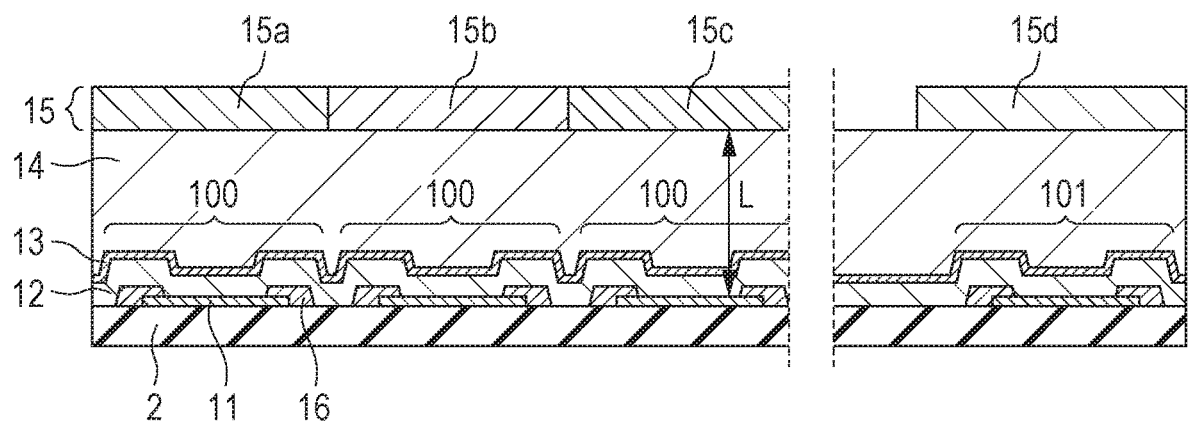
FIG. 6 is a sectional view of the exemplary organic light-emitting display device according to the embodiment of the disclosure.

FIG. 5 is a schematic plan view of a display device according to a third embodiment. FIG. 6 is a schematic sectional view along VI-VI in FIG. 5. A reducer of the embodiment causes the distance between light emitting elements and infrared light emitting elements to be larger than the distance between each light emitting element and another light emitting element.

In the embodiment, the distance between light emitting elements 100 and infrared light emitting elements 101 is made large. Since, by using this structure, the infrared light emitting elements 101 and the light emitting elements 100 are not close to each other, even if a light absorbing layer is not provided, it is possible to reduce the quantity of leakage light leaking to the light emitting elements 100 from the infrared light emitting elements 101.

Providing regions 21 between a display region 9 in which the light emitting elements 100 are disposed and infrared light emitting regions 20 in which the infrared light emitting elements 101 are disposed as shown in FIG. 5 is used because an arrangement for emitting infrared light for detecting a line of sight and a high definition display can both be realized.

The distance between the light emitting elements and the infrared light emitting elements is a distance that has little influence on a displaying operation and that no longer makes it possible to see leakage light leaking from infrared light-emitting pixels. Since leakage light is often seen in adjacent pixels, causing the distance between the adjacent pixels to be greater than or equal to the distance of a light emitting element of interest and an adjacent light emitting element makes it possible to decrease the likelihood of seeing leakage light. That is, when the display device includes a display element that is disposed adjacent to another display element and the distance between the other display element and each infrared light emitting element is a first distance and the distance between the display element and the other display element is a second distance, the first distance is larger than the second distance. In one embodiment, the first distance is to be greater than or equal to twice the second distance.

When the light emitting elements include color filters, if the distance from a light emitting position to each color filter in a vertical direction is L, causing the distance between the light emitting elements and the infrared light emitting elements to be greater than or equal to L in a horizontal direction causes the angle at which leakage light moves toward the color filters of the light emitting elements from the infrared light emitting elements to be greater than or equal to 45 degrees and the intensity of the leakage light in the direction of a front surface to be sufficiently reduced. That is, when the display elements include color filters disposed closer than a second electrode to a light extraction side and the distance between the second electrode and each color filter is a third distance, the first distance is larger than the third distance.

Although the first distance is to be larger than the third distance, it may be difficult to identify a light emitting position of a light emitting layer. Therefore, when the distance between an interface of the light emitting layer on a side of the second electrode and each color filter is a fourth distance, causing the first distance to be larger than the fourth distance makes it possible to obtain effects that are the same as those mentioned above.

By causing the distance between the light emitting elements 100 and the infrared light emitting elements 101 to be large as described above, not only the quantity of leakage light but also outflow of electric charges, that is, the quantity of leakage current leaking to an adjacent light emitting element when an infrared light emitting element has emitted light can be reduced. Therefore, it is possible to further decrease reduction in display quality caused by unintended emission of visible light.

Although in the embodiment, an example in which the distance between the display region 9 and each infrared light emitting region 20 is caused to be large is described, as long as the distance between the light emitting elements 100 and the infrared light emitting elements 101 is large, the position of each infrared light emitting region 20 is not limited to that of the embodiment. For example, the infrared light emitting elements 101 may be disposed in the display region as long as a displaying operation is not influenced.

When the infrared light emitting elements 101 are disposed only in a narrow region on an insulating layer 2, eyelids or the like may intercept infrared light that is being emitted to the eyeballs of a user. Therefore, in one embodiment, the infrared light emitting elements 101 is to be disposed on at least two sides, in another embodiment, on four sides of a region on the outer side of the display region 9.

Each region 21 between the display region 9 and the corresponding infrared light emitting region 20 may be an imaging region in which an imaging element is disposed.

Alternatively, each region 21 may be a contact region in which a wire and the second electrode are connected to an external power supply, or a dummy pixel region. The wire is embedded in an insulating layer of a switching element such as a transistor formed at the insulating layer. The dummy pixel region is provided for realizing manufacturing stability and reducing reflection.

Each region 21 may be provided with a color filter or a light absorbing layer. In one embodiment, a light absorbing layer is provided because the quantity of visible light that is emitted obliquely from the infrared light emitting elements 101 is further reduced.

Fourth Embodiment

Figure 7:
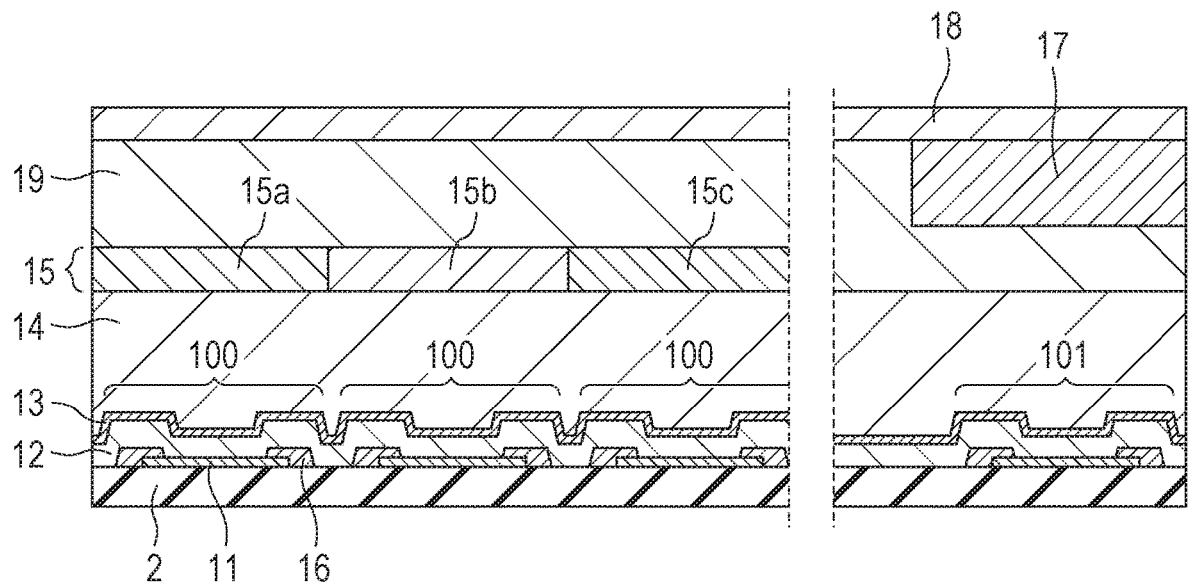
FIG. 7 is a sectional view of an exemplary organic light-emitting display device according to an embodiment of the disclosure.

FIG. 7 is a schematic sectional view of a display device according to a fourth embodiment. In the embodiment, as in the third embodiment, the distance between light emitting elements and infrared light emitting elements is large. As in the second embodiment, a wavelength converting layer 17 is provided above the infrared light emitting elements 101 and on a facing substrate. An end portion of the wavelength converting layer 17 is to be positioned between the light emitting elements 100 and the infrared light emitting elements 101 in the plan view. In the embodiment, since the distance between the light emitting elements 100 and the infrared light emitting elements 101 is large, the wavelength converting layer 17 can be easily disposed in the proper position. In this case, the position of the wavelength converting layer is determined by the position of the facing substrate. That is, that the wavelength converting layer 17 can be easily disposed in the proper position means that the facing substrate can be easily disposed in the proper position. According to the embodiment, since high-precision patterning and high-precision positioning do not need to be performed in the step of forming the wavelength converting layer on the facing substrate 18 and the step of bonding a substrate and the facing substrate to each other, manufacturing can be easily performed.

Other Embodiments

Figure 8A:
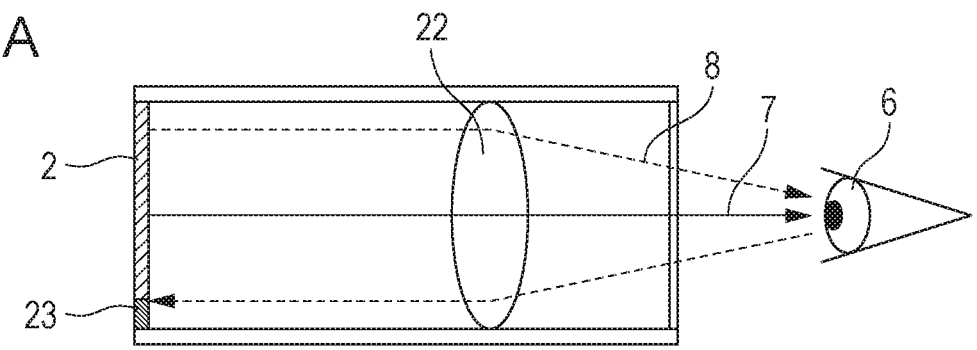
FIG. 8A is a schematic view of an example of an application of an organic light-emitting display device according to an embodiment of the disclosure.
Figure 8B:
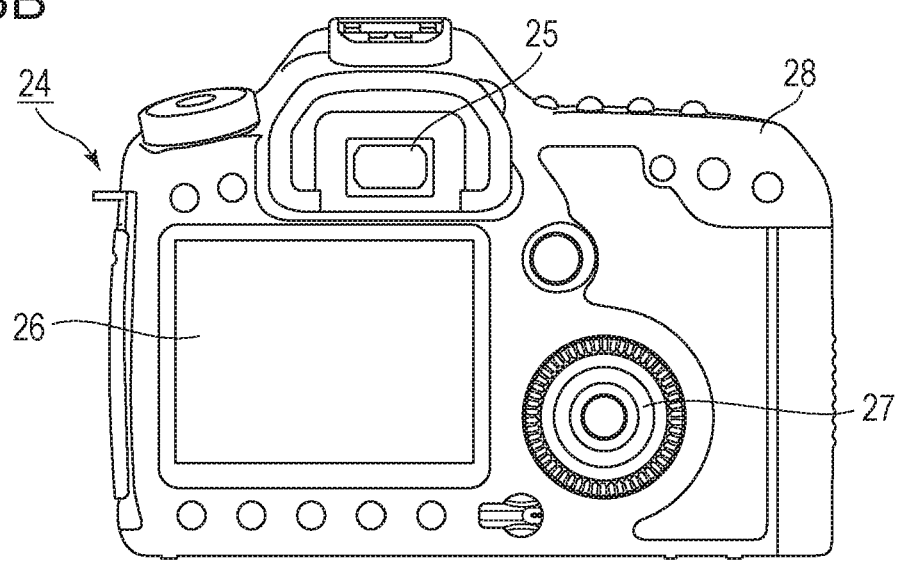
FIG. 8B illustrates an example of an imaging device, such as a camera.
Figure 8C:
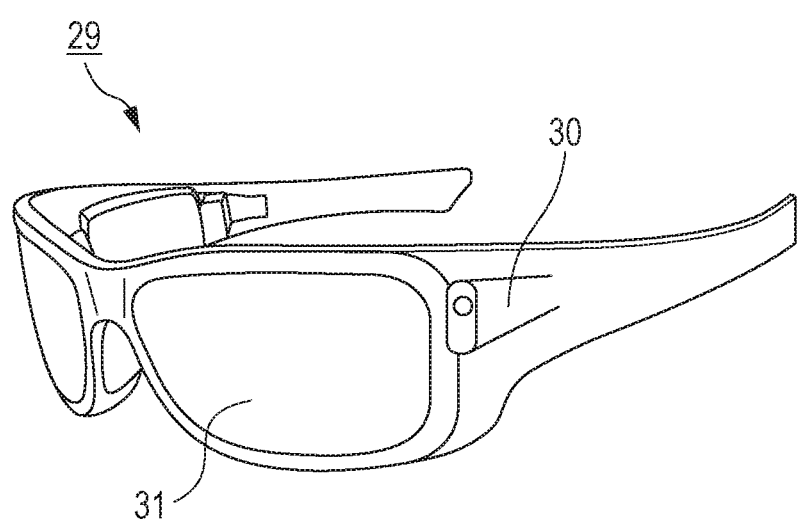
FIG. 8C is a schematic view of an example of smart glasses.

FIGS. 8A to 8C show an application example of a display device according to an embodiment of the disclosure. The display device according to this embodiment of the disclosure is applicable to an information display device, such as a camera viewfinder, a head mount display, or smart glasses.

FIG. 8A is a schematic view of an exemplary structure used as a viewfinder of an imaging device, such as a camera. Display light 7 and infrared light 8 are emitted from a display device 1, pass through the same optical member 22, and reach an eyeball 6 of a user. The infrared light reflected by the eyeball 6 of the user is converted into electrical information by an imaging device 23 including an imaging element, and a line of sight is detected based on the information. Instead of providing the imaging device, an imaging element may be provided on an insulating layer of the display device 1 and used as a display imaging device.

FIG. 8B shows an example of an imaging device, such as a camera. An imaging device 24 includes a viewfinder 25, a display 26, an operating unit 27, and a housing 28. The display device in FIG. 8A is provided at the viewfinder 25.

Although FIG. 8A shows an example in which the display light 7 and the infrared light 8 pass through the same optical member 22, different optical members may be provided for the display light and the infrared light. Instead of providing the imaging device, an imaging element may be provided on a substrate of the display device 1 and used as a display imaging device. Detected line-of-sight information can be used in controlling the display device and various devices that are connected to the display device, such as when controlling the focus of a camera or the resolution of a display image, or when substituting for operations using buttons.

The display device according to an embodiment of the disclosure may include an imaging device including a light receiving element, and may control a display image of the display device based on line-of-sight information of a user from the imaging device.

Specifically, on the basis of the line-of-sight information, the display device determines a first field-of-view region that a user gazes at and a second field-of-view region other than the first field-of-view region. The first field-of-view region and the second field-of-view region may be determined by a controlling device of the display device, or may be determined by an external controlling device in which case the result of determination is received by the display device. In a display region of the display device, the display resolution of the first field-of-view region may be controlled to be higher than the display resolution of the second field-of-view region. That is, the resolution of the second field-of-view region may be lower than the resolution of the first field-of-view region.

The display region includes a first display region and a second display region differing from the first display region, and a region having high priority is determined from among the first display region and the second display region based on the line-of-sight information. The first field-of-view region and the second field-of-view region may be determined by a controlling device of the display device, or may be determined by an external controlling device in which case the result of determination is received by the display device. The resolution of the region having high priority may be controlled to be higher than the resolution of the region other than the region having high priority. That is, the resolution of the region having a relatively low priority may be low.

AI may be used to determine the first field-of-view region or the region having high priority. AI may be a model that is formed to estimate the angle of a line of sight from an image of an eyeball, or the distance from a location beyond the line of sight to an object, by using the image of the eyeball and the actual viewing direction of the eyeball as teacher data. An AI program may be provided in the display device, the imaging device, or an external device. When the AI program is provided in an external device, the AI program is transferred to the display device via communication.

When a displaying operation is controlled based on the detection of sight, application can be made to smart glasses further including an imaging device that images the outside. Smart glasses are capable of displaying imaged external information in real time.

Alternatively, it is possible to use a structure that includes a first imaging device including a light receiving element that receives infrared light and a second imaging device used for imaging the outside and including a light receiving element differing from the light receiving element of the first imaging device, and that controls the imaging resolution of the second imaging device based on user line-of-sight information of the first imaging device. It is possible to reduce the quantity of information by causing the imaging resolution of a region other than a region having priority to be lower than the imaging resolution of the region having priority. Therefore, power consumption and occurrence of a delay in a displaying operation can be reduced. The region having priority may be a first imaging region and the region having lower priority than the first imaging region may be a second imaging region.

FIG. 8C is a schematic view of an example of smart glasses. An imaging display device 29, which typifies smart glasses, includes a controlling unit 30, a transparent display unit 31, and an external imaging unit (not shown). When applied to smart glasses, both the display device and the external imaging device can be controlled based on detected line-of-sight information, as a result of which power consumption and occurrence of a delay in a displaying operation can be reduced. For example, by reducing occurrence of display of a region other than a region that a user is gazing at in a display region and reducing the imaging resolution, it is possible to reduce both the quantity of imaging information and the quantity of display information and to reduce power consumption and occurrence of a delay in a displaying operation.

As described above, according to an embodiment of the disclosure, it is possible to provide a display device that makes it possible to, by reducing the frequency with which visible light that is emitted by an infrared light emitting element becomes leakage light that leaks to an adjacent pixel, decrease a reduction in display quality even if the display device is reduced in size.

According to the aspect of the embodiments, it is possible to provide a display device that makes it possible to, by reducing the frequency with which visible light that is emitted by an infrared light emitting element becomes leakage light that leaks to an adjacent pixel, decrease a reduction in display quality even if the display device is reduced in size.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2019-130385, filed Jul. 12, 2019, which is hereby incorporated by reference herein in its entirety.

What is claimed is:

1. A device comprising:
a display element and an infrared light emitting element that are disposed on an insulating layer; and
a reducer configured to reduce a quantity of light that is emitted in a direction from the infrared light emitting element towards the display element, in plan view from a direction perpendicular to the insulating layer,
wherein the display element and the infrared light emitting element are not overlapped in the plan view.

2. The device according to claim 1, wherein the reducer includes a light absorbing layer that is disposed between the display element and the infrared light emitting element in the plan view from the direction perpendicular to the insulating layer, and that absorbs at least a portion of visible light.

3. The device according to claim 2, wherein the infrared light emitting element includes an element that includes a first electrode, a light emitting layer, and a second electrode in order from the insulating layer, and
wherein the light absorbing layer is disposed closer than the second electrode to a light extraction side.

4. The device according to claim 1, further comprising:
another display element that is disposed adjacent to the display element,
wherein the reducer is configured by an arrangement in which a distance between the display element and the infrared light emitting element is larger than a distance between the display element and the other display element.

5. The device according to claim 4, wherein the distance between the display element and the infrared light emitting element is greater than or equal to twice the distance between the display element and the other display element.

6. The device according to claim 1,
wherein the display element includes a first electrode, a light emitting layer, a second electrode, and a color filter in order from the insulating layer,
wherein when a distance between the display element and the infrared light emitting element is a first distance and a distance between the second electrode and the color filter is a third distance, and
wherein the reducer is configured such that the first distance is larger than the third distance.

7. The device according to claim 1,
wherein the display element includes a first electrode, a light emitting layer, a second electrode, and a color filter in order from the insulating layer,
wherein when a distance between the display element and the infrared light emitting element is a first distance and a distance between an interface of the light emitting layer on a side of the second electrode and the color filter is a fourth distance, and
wherein the reducer is configured such that the first distance is larger than the fourth distance.

8. The device according to claim 1, wherein the infrared light emitting element includes a first reflecting surface, a light emitting layer, and a second reflecting surface which are arranged in that order from the insulating layer,
wherein a distance between the first reflecting surface and the second reflecting surface is a distance that increases an intensity of light in an infrared range, and
wherein the reducer is configured such that the intensity of the light in the infrared range is increased.

9. The device according to claim 8, wherein the distance between the first reflecting surface and the second reflecting surface is a distance that increases the intensity of the light in the infrared range and that decreases an intensity of light in a visible light range.

10. The device according to claim 8, wherein the display element includes a first reflecting surface, a light emitting layer, and a second reflecting surface in order from the insulating layer, and a distance between the first reflecting surface and the second reflecting surface of the display element and the distance between the first reflecting surface and the second reflecting surface of the infrared light emitting element differ from each other.

11. The device according to claim 1, further comprising:
a first light emitting region that emits visible light and a second light emitting region that emits infrared light, the first light emitting region including the display element and the second light emitting region including the infrared light emitting element,
wherein the second light emitting region is disposed between the first light emitting region and an end of the insulating layer, and the first light emitting region is not disposed between the second light emitting region and the end of the insulating layer.

12. The device according to claim 1, comprising:
a first light emitting region that emits visible light and a second light emitting region that emits infrared light, the first light emitting region including the first display element and the second light emitting region including the infrared light emitting element,
wherein the second light emitting region is disposed between the first light emitting region and an end of the insulating layer and between the first light emitting region and another end of the insulating layer differing from the end of the insulating layer, and
wherein the first light emitting region is not disposed between the second light emitting region and the end of the insulating layer and between the second light emitting region and the other end of the insulating layer differing from the end of the insulating layer.

13. The device according to claim 12, further comprising:
a first light emitting region that emits visible light and a second light emitting region that emits infrared light, the first light emitting region including the display element and the second light emitting region including the infrared light emitting element,
wherein the second light emitting region surrounds the first light emitting region.

14. The device according to claim 1, wherein the display element and the infrared light emitting element each include a first electrode, a second electrode, and one common organic compound layer including a light emitting layer that is disposed between the first electrode and the second electrode, and the one common organic compound layer is shared by the display element and the infrared light emitting element.

15. The device according to claim 1, further comprising:
a substrate on which the insulating layer is disposed; and
a light receiving element that is disposed on the substrate and that receives light emitted from the infrared light emitting element.

16. The device according to claim 15, further comprising:
an imaging device that includes the light receiving element,
wherein a display image of the light emitting device is controlled based on line-of-sight information of a user from the imaging device.

17. The device according to claim 16,
wherein a first field-of-view region that the user gazes at and a second field-of-view region are determined based on the line-of-sight information, and
wherein, in a display region of the light emitting device, a display resolution of the first field-of-view region is controlled to be higher than a display resolution of the second field-of-view region.

18. The device according to claim 17, further comprising:
a first imaging device that includes the light receiving element and a second imaging device that includes another light receiving element and that images an outside,
wherein an imaging resolution of the second imaging device is controlled based on line-of-sight information of a user of the first imaging device.

19. The device according to claim 18, wherein a first field-of-view region that the user gazes at and a second field-of-view region are determined based on the line-of-sight information, and
wherein, in a display region of the light emitting device, a display resolution of the first field-of-view region is controlled to be higher than a display resolution of the second field-of-view region.

20. The device according to claim 1, wherein the infrared light emitting element includes a wavelength converting layer that absorbs light and emits infrared light.

21. The device according to claim 1, further comprising:
another display element that is disposed adjacent to the display element,
wherein the reducer is configured by an arrangement in which a distance between the display element and the infrared light emitting element in the plan view is larger than a distance between the display element and the other display element in the plan view.

* * * * *